(12) United States Patent
Hirai et al.

(10) Patent No.: US 10,107,698 B2
(45) Date of Patent: Oct. 23, 2018

(54) SEMICONDUCTOR DEVICE, AND RESISTANCE MEASURING SYSTEM AND PRESSURE INSTRUMENTATION DEVICE EACH INCLUDING THE SEMICONDUCTOR DEVICE

(71) Applicant: Renesas Electronics Corporation, Tokyo (JP)

(72) Inventors: Masato Hirai, Tokyo (JP); Siewling Lim, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 138 days.

(21) Appl. No.: 14/865,187

(22) Filed: Sep. 25, 2015

(65) Prior Publication Data

US 2016/0097692 A1 Apr. 7, 2016

(30) Foreign Application Priority Data

Oct. 6, 2014 (JP) .................................. 2014-205413

(51) Int. Cl.
*G01L 1/22* (2006.01)
*G01R 27/02* (2006.01)

(52) U.S. Cl.
CPC ............ *G01L 1/2262* (2013.01); *G01R 27/02* (2013.01)

(58) Field of Classification Search
CPC . G01L 9/00; G01L 9/02; G01L 1/2262; G01L 19/147
USPC .......... 73/754; 324/525, 526, 647, 648, 705, 324/706, 725
See application file for complete search history.

(56) References Cited

U.S. PATENT DOCUMENTS

| | | | | |
|---|---|---|---|---|
| 3,048,776 A | * | 8/1962 | Logan | G01N 27/041 324/717 |
| 5,539,406 A | * | 7/1996 | Kouno | H03M 1/146 341/155 |
| 7,521,937 B2 | * | 4/2009 | Nagata | G01R 31/3004 324/523 |
| 7,834,645 B2 | * | 11/2010 | Yanagisawa | G01R 15/16 324/457 |
| 7,926,352 B2 | * | 4/2011 | Matsushima | G01L 1/2262 73/725 |

FOREIGN PATENT DOCUMENTS

JP 3959828 B2 8/2007

* cited by examiner

*Primary Examiner* — Jonathan Dunlap
*Assistant Examiner* — Octavia Hollington
(74) *Attorney, Agent, or Firm* — McGinn I.P. Law Group, PLLC.

(57) ABSTRACT

A semiconductor device includes a variable current generating unit that sends a direct current of a value according to a control signal from one measurement node of a bridge circuit in which a change amount of a resistance value of a pressure-sensitive resistance element appears as a potential difference between measurement nodes, a potential difference determining unit that determines whether or not the potential difference has been generated, and a control unit that outputs the control signal to the variable current generating unit so that the variable current generating unit sends the direct current of a value that does not generate the potential difference based on a determination result of the potential difference determining unit.

18 Claims, 8 Drawing Sheets

– 1 –

SEMICONDUCTOR DEVICE, AND RESISTANCE MEASURING SYSTEM AND PRESSURE INSTRUMENTATION DEVICE EACH INCLUDING THE SEMICONDUCTOR DEVICE

CROSS-REFERENCE TO RELATED APPLICATIONS

This application is based upon and claims the benefit of priority from Japanese patent application No. 2014-205413, filed on Oct. 6, 2014, the disclosure of which is incorporated herein in its entirety by reference.

BACKGROUND

The present invention relates to a semiconductor device, and a resistance measuring system and a pressure instrumentation device each including the semiconductor device and, for example, to a semiconductor device suitable for suppressing increase of a circuit scale, and a resistance measuring system and a pressure instrumentation device each including the semiconductor device.

An instrumentation device that measures a pressure received from a measurement object, such as a scale to measure human weight, measures a change amount of a resistance value of a pressure-sensitive resistance element whose resistance value changes according to pressure change, and calculates a pressure (for example, weight) of the measurement object based on a measurement result of the change amount.

In this instrumentation device, for example, abridge circuit including four resistance elements including the pressure-sensitive resistance element is used as a pressure sensor. In this bridge circuit, the change amount of the resistance value of the pressure-sensitive resistance element appears as a potential difference between a first and a second measurement nodes of the bridge circuit.

A related technology is disclosed in Japanese Patent No. 3959828 Specification. A configuration disclosed in Japanese Patent No. 3959828 Specification includes: a resistance bridge circuit including a pressure-sensitive resistor whose resistance value changes by pressure change; an amplifier circuit that amplifies a potential difference of two voltage measuring points of the resistance bridge circuit generated according to a change amount of the resistance value of the pressure-sensitive resistor; and a voltage measuring circuit that measures an output voltage of the amplifier circuit.

SUMMARY

In the configuration of Japanese Patent No. 3959828 Specification, when the change amount of the resistance value of the pressure-sensitive resistor is large, the potential difference of the two voltage measuring points of the resistance bridge circuit becomes large, and thus, it is necessary to reduce an amplification factor of the amplifier circuit and to thereby suppress the output voltage of the amplifier circuit in an allowable input voltage range of the voltage measuring circuit. Note that generally, an instrumentation amplifier circuit is used for an amplifier circuit, and that an AD converter is used for a voltage measuring circuit.

Here, since removal of an error by the voltage measuring circuit becomes more difficult as the amplification factor of the amplifier circuit becomes smaller, it is necessary to increase a resolution of the voltage measuring circuit in order to avoid the difficulty. For example, a 16-bit or a 24-bit AD converter with a high resolution needs to be used as the voltage measuring circuit. As a result, there has been a problem that a circuit scale increases in the configuration of Japanese Patent No. 3959828 Specification. Other problems and new features will be apparent from description of the specification and accompanying drawings.

According to one embodiment, a semiconductor device includes: a variable current generating unit that sends a direct current of a value according to a control signal from one measurement node of a bridge circuit in which a change amount of a resistance value of a pressure-sensitive resistance element appears as a potential difference between a first and a second measurement nodes; a potential difference determining unit that determines whether or not the potential difference has been generated; and a control unit that outputs the control signal to the variable current generating unit so that the variable current generating unit sends the direct current of a value that does not generate the potential difference based on a determination result of the potential difference determining unit.

According to the one embodiment, there can be provided a semiconductor device that can suppress a circuit scale, and a resistance measuring system including the semiconductor device.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Hereinafter, embodiments will be explained with reference to drawings. Note that since the drawings are simplified, a technical scope of the embodiments should not be narrowly construed on the basis of description of the drawings. In addition, the same symbol is attached to the same element, and overlapping explanation is omitted.

In the following embodiments, when there is the necessity for convenience, the explanation will be divided into a plurality of sections or embodiments. However, unless otherwise specified, they are not irrelevant with each other but they have a relationship that one is a modified example, an application, detailed explanation, supplementary explanation, etc. of a part or all of the other. In addition, in the following embodiments, when the number of elements, etc. (including the number, a numeric value, quantity, a range, etc.) are referred to, the number of elements may be not restricted to a specific number but may be not less than or not more than the specific number, except for a case where it is specified in particular or clearly restricted to the specific number in principle, etc.

Further, in the following embodiments, the component (including an operation step, etc.) is not necessarily essential, except for a case where it is specified in particular or it is considered to be clearly essential in principle. Similarly, in the following embodiments, when referring to a shape, a positional relationship, etc. of the component etc, what is substantially analogous or similar to the shape etc., and the like shall be included, except for a case where it is specified in particular or clearly not considered to be so in principle. The same applies to the above-described number of elements etc. (including the number, a numeric value, quantity, a range, etc.).

First Embodiment

Figure 1:
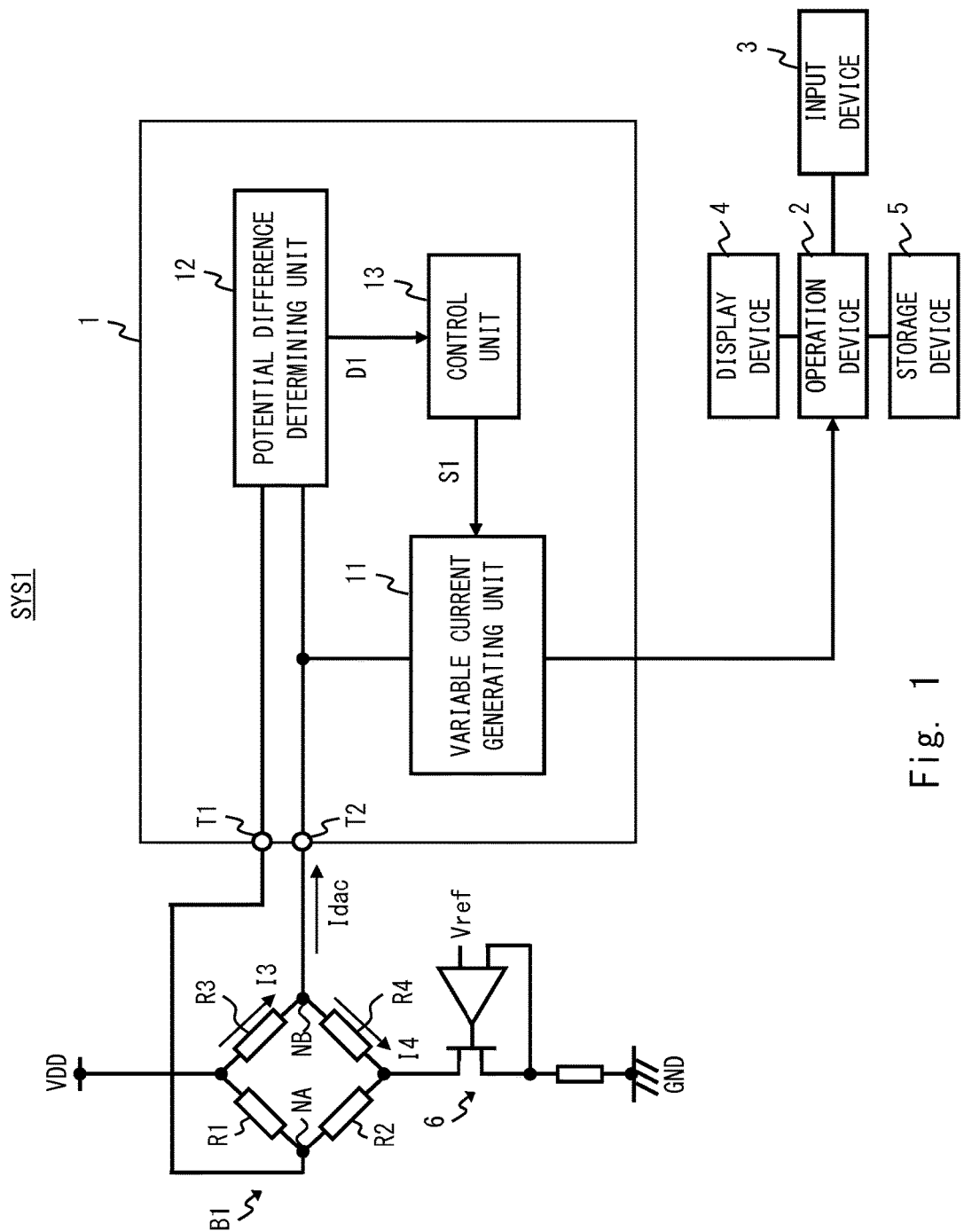
FIG. 1 is a block diagram showing a configuration of a resistance measuring system including a semiconductor device according to a first embodiment.

FIG. 1 is a block diagram showing a configuration of a resistance measuring system SYS1 including a semiconductor device 1 according to a first embodiment.

The semiconductor device 1 and the resistance measuring system SYS1 including the same according to the embodiment measures a value of a direct current in a case of controlling the direct current that flows from one measurement node so as not to generate a potential difference between two measurement nodes of a bridge circuit. A change amount of a resistance value of a pressure-sensitive resistance element included in the bridge circuit can be calculated based on the value of the direct current measured at this time. Additionally, weight etc. can be estimated from the calculated change amount of the resistance value of the pressure-sensitive resistance element. Here, since the semiconductor device 1 and the resistance measuring system SYS1 including the same according to the embodiment can measure weight using a DA converter, a comparator, etc. that are general-purpose parts, and need not include a voltage measuring circuit with a high resolution unlike a related technology, increase in a circuit scale can be suppressed. In addition, increase in power consumption can also be suppressed.

Hereafter, the above will be specifically explained.

As shown in FIG. 1, the resistance measuring system SYS1 is, for example, a scale to measure human weight, and includes: the semiconductor device 1; an operation device (an operation processing device) 2; an input device 3; a display device 4; a storage device 5; and a bridge circuit B1.

The bridge circuit B1 is a so-called pressure sensor, and is a circuit that generates a voltage (a potential difference) according to change of a pressure received from a measurement object. Specifically, the bridge circuit B1 has: resistance elements R1 to R3; a pressure-sensitive resistance element R4 whose resistance value changes according to pressure change; and a constant current source 6.

The resistance element R1 is provided between a power supply voltage terminal (hereinafter referred to as a power supply voltage terminal VDD) to which a power supply voltage VDD is supplied and a measurement node (a first measurement node) NA. The resistance element R2 is provided between the constant current source 6 and the measurement node NA. The resistance element R3 is provided between the power supply voltage terminal VDD and a measurement node (a second measurement node) NB. The pressure-sensitive resistance element R4 is provided between the constant current source 6 and the measurement node NB.

The constant current source 6, for example, has: an NMOS transistor; an amplifier circuit; and a resistance element. The NMOS transistor and the resistance element are provided in series between a connection node of the resistance elements R2 and R4, and a ground voltage terminal (hereinafter referred to as a ground voltage terminal GND) to which a ground voltage GND is supplied. The amplifier circuit amplifies a potential difference between a voltage of a connection node between the NMOS transistor and the resistance element, and a reference voltage Vref, and applies it to a gate of the NMOS transistor. Thereby, the constant current source 6 sends a constant current to the ground voltage terminal GND from the connection node of the resistance elements R2 and R4.

When not receiving a pressure, the pressure-sensitive resistance element R4 indicates the same resistance value as the resistance elements R1 to R3. Accordingly, when the pressure-sensitive resistance element R4 does not receive the pressure, respective potentials Va and Vb of the measurement nodes NA and NB indicate the same value. That is, a potential difference $\Delta V$ is not generated between the potentials Va and Vb. Note that non-generation of the potential difference $\Delta V$ shall include not only a case where the potential difference $\Delta V$ becomes completely 0 V, but also a case where the potential difference $\Delta V$ slightly deviates from 0 V due to manufacturing variations of the resistance elements R1 to R4, etc.

In contrast to that, when the pressure-sensitive resistance element R4 receives the pressure, a resistance value of the pressure-sensitive resistance element R4 becomes larger than that of the resistance element R2, and thus, the respective potentials Va and Vb of the measurement nodes NA and NB indicate different values. That is, the potential difference $\Delta V$ between the potentials Va and Vb becomes larger than 0.

The semiconductor device 1 includes: a variable current generating unit 11; a potential difference determining unit 12; and a control unit 13. In addition, external terminals T1 and T2 connected to the measurement nodes NA and NB of the bridge circuit B1 are provided in the semiconductor device 1.

The variable current generating unit 11 sends an adjustable direct current Idac. More specifically, the variable current generating unit 11 sends the direct current Idac of a current value according to a control signal S1 to the ground voltage terminal GND from the measurement node NB through the external terminal T2. For example, the variable current generating unit 11 is a current output type DA converter.

The potential difference determining unit 12 determines whether or not the potential difference $\Delta V$ has been generated between the respective potentials Va and Vb of the measurement nodes NA and NB supplied to the external terminals T1 and T2. For example, the potential difference determining unit 12 includes a comparator, makes a determination result D1 inactive (for example, an L level) when the potential difference $\Delta V$ has been generated (i.e., when $\Delta V \neq 0$), and makes the determination result D1 active (for example, an H level) when the potential difference $\Delta V$ has not been generated (i.e., when $\Delta V = 0$).

The control unit 13 is, for example, a microcomputer, and outputs the control signal S1 according to the determination result D1 of the potential difference determining unit 12. Specifically, the control unit 13 outputs the control signal S1 to the variable current generating unit 11 so that the variable current generating unit 11 sends the direct current Idac of a current value at which the determination result D1 becomes active (i.e., the potential difference ΔV is not generated).

For example, when the potential Vb is larger than the potential Va, the control unit 13 controls the variable current generating unit 11 to increase the current value of the direct current Idac until the potential Vb indicates the same value as the potential Va. When the potential Vb then indicates the same value as the potential Va, the control unit 13 controls the variable current generating unit 11 not to change the current value of the direct current Idac any more.

Here, a change amount ΔR4 of the resistance value of the pressure-sensitive resistance element R4 can be calculated based on the value of the direct current Idac in a case where the potential difference ΔV between the measurement nodes NA and NB of the bridge circuit B1 is controlled not to be generated. Hereinafter, the above will be explained in detail using formulas.

First, when the pressure-sensitive resistance element R4 does not receive the pressure as mentioned above, a relation between the respective potentials Va and Vb of the measurement nodes NA and NB is represented as the following Formula (1).

$$Va=Vb \qquad (1)$$

Next, if the resistance value of the pressure-sensitive resistance element R4 in the case where the pressure-sensitive resistance element R4 receives the pressure is set to be R4a, the resistance value of the pressure-sensitive resistance element R4 in the case where the pressure-sensitive resistance element R4 does not receive the pressure is R4, and the change amount of the resistance value of the pressure-sensitive resistance element R4 is ΔR4, a relation among these is represented as the following Formula (2).

$$R4a=R4+\Delta R4 \qquad (2)$$

Note that the larger the change amount ΔR4 of the resistance value of the pressure-sensitive resistance element R4 is, the larger the potential difference ΔV between the measurement nodes NA and NB becomes.

Here, when the resistance value of the pressure-sensitive resistance element R4 that has received the pressure changes, and a value of a current that flows through the pressure-sensitive resistance element R4 changes, the semiconductor device 1 controls the current value of the direct current Idac according to the change amount ΔR4 of the resistance value of the pressure-sensitive resistance element R4, and thereby keeps values of a current that flows through the resistance element R3 the same before and after the pressure is applied. Accordingly, the potential Vb indicates the same value as the potential Va before and after the pressure is applied.

Specifically, if the value of the current that flows through the resistance element R3 is set to be I3, the value of the current that flows through the pressure-sensitive resistance element R4 is I4, and the value of the current that flows from the measurement node NB through the external terminal T1 is Idac, a relation among these is represented as the following Formula (3).

$$I3=I4+Idac \qquad (3)$$

As can be seen from Formula (3), when the resistance value of the pressure-sensitive resistance element R4 changes, and the value of the current that flows through the pressure-sensitive resistance element R4 changes, the current value Idac is controlled so that a sum of the current values I4 and Idac becomes the current value I3.

For example, when the change amount of the resistance value of the pressure-sensitive resistance element R4 is small, and change (decrease) of the current value I4 is small, the current value Idac is controlled to be small. On the other hand, when the change amount of the resistance value of the pressure-sensitive resistance element R4 is large, and change (decrease) of the current value I4 is large, the current value Idac is controlled to be large.

In addition, the current value I4 is represented as the following Formula (4).

$$I4=Vb/R4a \qquad (4)$$

Formula (5) is derived from Formulas (2), (3), and (4).

$$\Delta R4=\{Vb/(I3-Idac)\}-R4 \qquad (5)$$

As can be seen from Formula (5), since Vb, I3, and R4 are constant before and after the pressure is applied, the change amount ΔR4 of the resistance value of the pressure-sensitive resistance element R4 depends only on the current value Idac. Therefore, the change amount ΔR4 can be calculated only by measuring the current value Idac. Additionally, weight etc. can be estimated from the calculated change amount ΔR4.

For example, if a voltage value of a power supply voltage Vdd is set to be 5 V, resistance values of the resistance elements R1 to R4 are 10 kΩ, and the current value Idac is 0.128 mA, the potential Vb is 2.5 V (=5 V/2) since it is constant before and after the pressure is applied. In addition, the current value I3 is 0.25 mA (=2.5 V/10 kΩ) since it is constant before and after the pressure is applied. When these values are assigned to Formula (5), the change amount ΔR4 of the resistance value of the pressure-sensitive resistance element R4 is calculated as follows.

$$\Delta R4=\{2.5\ V/(0.25\ mA-0.128\ mA)\}-10\ k\Omega=10.5\ [k\Omega]$$

Now, return to explanation of each component of FIG. 1.

The input device 3 is the device to input information necessary for estimation of weight etc. The operation device 2 is the device that calculates the change amount of the resistance value of the pressure-sensitive resistance element R4 from the measurement result (current value Idac) by the semiconductor device 1, or estimates weight from the calculated change amount of the resistance value of the pressure-sensitive resistance element R4. The display device 4 is the device that displays the weight etc. estimated by the operation device 2. The storage device 5 is the device that stores past data, or stores an operation program of the operation device 2, etc.

As described above, the semiconductor device 1 and the resistance measuring system SYS1 including the same measures the value of the direct current Idac in the case of controlling the direct current Idac that flows from the measurement node NB so as not to generate the potential difference ΔV between the measurement nodes NA and NB of the bridge circuit B1. The change amount of the resistance value of the pressure-sensitive resistance element R4 included in the bridge circuit B1 can be calculated based on the value of the direct current Idac measured at this time. Additionally, weight can be estimated from the calculated change amount of the resistance value of the pressure-sensitive resistance element R4. Here, since the semiconductor device 1 and the resistance measuring system SYS1 including the same according to the embodiment can measure weight using the variable current generating unit 11 and the potential difference determining unit 12 including general-purpose parts, and need not include a voltage measuring circuit with a high resolution unlike the related technology, increase in a circuit scale can be suppressed. In addition, increase in power consumption can also be suppressed.

Note that in a configuration of the related technology, the potential difference ΔV between the measurement nodes NA and NB is amplified in an amplifier circuit, and is subsequently measured using a voltage measuring circuit, such as an AD converter. In this configuration, when the potential difference ΔV is large, it is necessary to reduce an amplification factor of the amplifier circuit and to thereby suppress an output voltage of the amplifier circuit in an allowable input voltage range of the voltage measuring circuit. Here, removal of an error by the voltage measuring circuit becomes more difficult as the amplification factor of the amplifier circuit becomes smaller. Consequently, it is necessary to use a voltage measuring circuit with a high resolution in order to avoid the difficulty. As a result, all of a circuit scale, power consumption, and a measurement time increase.

In contrast to that, the semiconductor device 1 converts the potential difference ΔV between the measurement nodes NA and NB into the direct current Idac, then measures the current value of the direct current Idac, and thereby indirectly measures the potential difference ΔV. At this time, the semiconductor device 1 controls the direct current Idac so that the potential difference ΔV becomes around 0 V, and then indirectly measures the potential difference ΔV from a value of the direct current Idac at that time, or it amplifies the potential difference ΔV that has become not more than a minimum resolution of the variable current generating unit 11 as needed, and measures the potential difference ΔV. Even in a latter case, the amplifier circuit need not measure a wide range of potential difference ΔV, and may just be able to measure a narrow range of potential difference ΔV with a constant amplification factor. In addition, since the semiconductor device 1 measures a resolution according to a total number of bits of the potential difference determining unit 12 (the comparator or the AD converter) and the variable current generating unit 11 in the above-described any case, the respective number of bits of the potential difference determining unit 12 and the variable current generating unit 11 can be distributed to be reduced. Thereby, the potential difference determining unit 12 can be configured by a general-purpose comparator or AD converter, and the variable current generating unit 11 can be configured with the small number of bits. As a result, the semiconductor device 1 can suppress all of the circuit scale, power consumption, and increase in the measurement time.

Note that when the potential difference ΔV cannot be made to be 0 V due to a limit of the resolution of the variable current generating unit 11, an amplifier circuit that amplifies the potential difference ΔV that has become not more than the minimum resolution of the variable current generating unit 11, and an AD converter that measures an output voltage of the amplifier circuit may be further provided, and the potential difference ΔV may be measured. In this case, since the amplifier circuit may just be able to amplify the potential difference ΔV in a decided voltage range, an amplification factor of the amplifier circuit can be fixed. In addition, since the amplifier circuit amplifies the potential difference ΔV not more than the minimum resolution of the variable current generating unit 11 with an amplification factor large to some extent, an error can be removed even by an AD converter with a low resolution. Accordingly, since only the amplifier circuit with the constant amplification factor and the AD converter with the low resolution may just be added, increase in the circuit scale and increase in power consumption are suppressed.

In this case, the potential difference determining unit 12 determines whether or not the potential difference ΔV falls within a range of a predetermined value not more than the minimum resolution of the variable current generating unit 11. Specifically, the potential difference determining unit 12 outputs the determination result D1 having switched, for example, from the L level to the H level as a determination result indicating that the potential difference ΔV has fallen within the range of the predetermined value. In addition, in this case, the control unit 13 outputs the control signal S1 to the variable current generating unit 11 so that the variable current generating unit 11 sends the direct current Idac of a current value at which the potential difference ΔV falls within the range of the predetermined value based on the determination result of the potential difference determining unit 12.

In addition, although in the embodiment, a case has been explained as an example where the resistance measuring system SYS1 is the scale to measure human weight, the present invention is not limited to this, and the resistance measuring system SYS1 can be used as an arbitrary measurement system that measures a pressure received from a measurement object.

(Specific Configuration Example of Resistance Measuring System SYS1)

Figure 2:
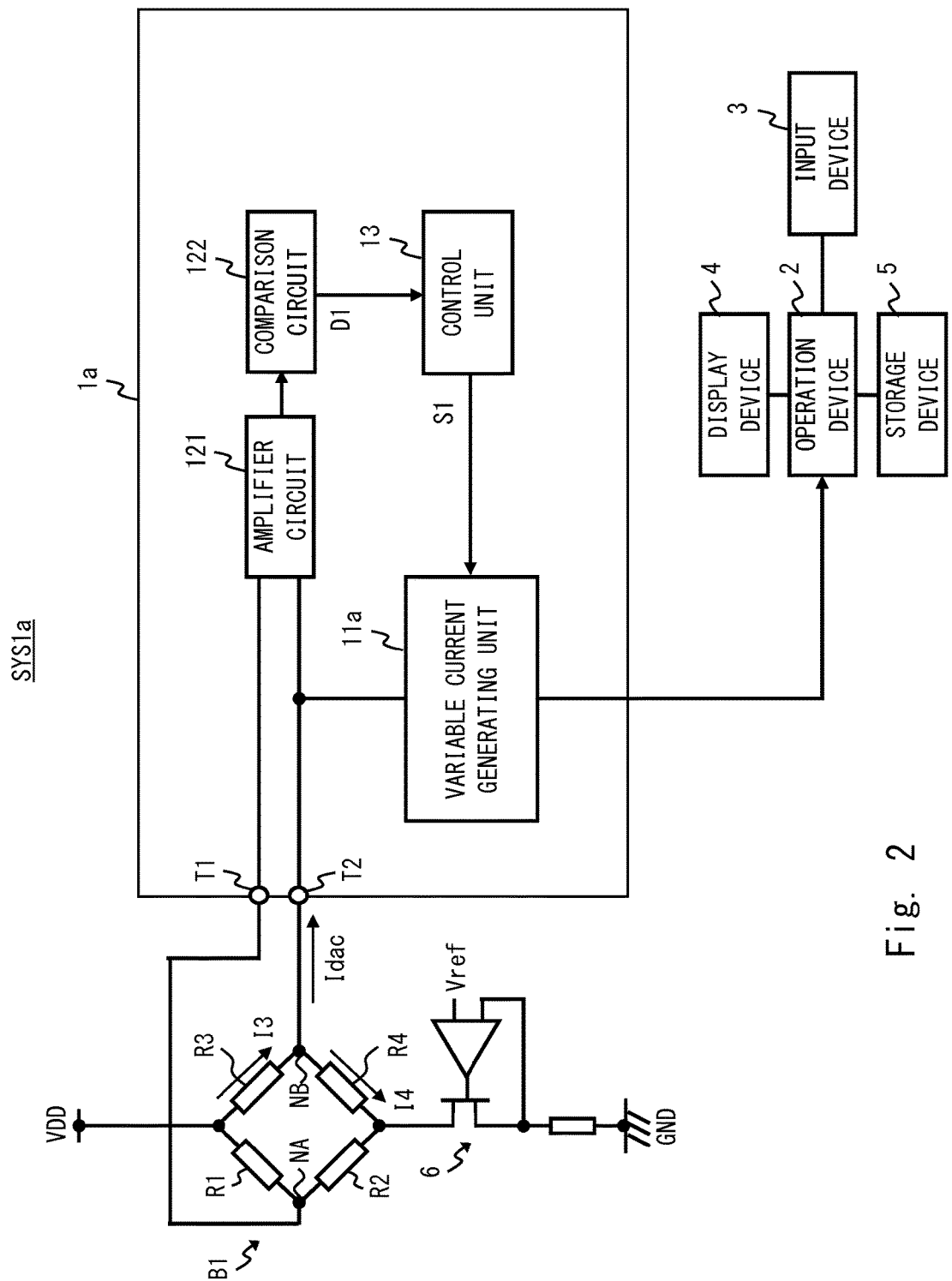
FIG. 2 is a block diagram showing a specific configuration example of the resistance measuring system shown in FIG. 1.

FIG. 2 is a block diagram showing a specific configuration example of the resistance measuring system SYS1 as a resistance measuring system SYS1a. In FIG. 2, a semiconductor device 1a is shown as a specific configuration example of the semiconductor device 1. Since other configurations of the resistance measuring system SYS1a are similar to those of the resistance measuring system SYS1, the semiconductor device 1a will be mainly explained hereinafter.

The semiconductor device 1a includes a variable current generating unit 11a as the variable current generating unit 11, and also includes an amplifier circuit 121 and a comparator 122 as the potential difference determining unit 12.

The amplifier circuit 121 amplifies the potential difference ΔV between the respective potentials Va and Vb of the measurement nodes NA and NB supplied to the external terminals T1 and T2. The comparator 122 compares the amplified potential difference ΔV with the ground voltage GND, and outputs a comparison result as the determination result D1. For example, the comparator 122 outputs the determination result D1 of the L level when the amplified potential difference ΔV is larger than the ground voltage GND, and outputs the determination result D1 of the H level when the amplified potential difference ΔV indicates the ground voltage GND (0 V).

(Specific Configuration Example of Variable Current Generating Unit 11a)

Figure 3:
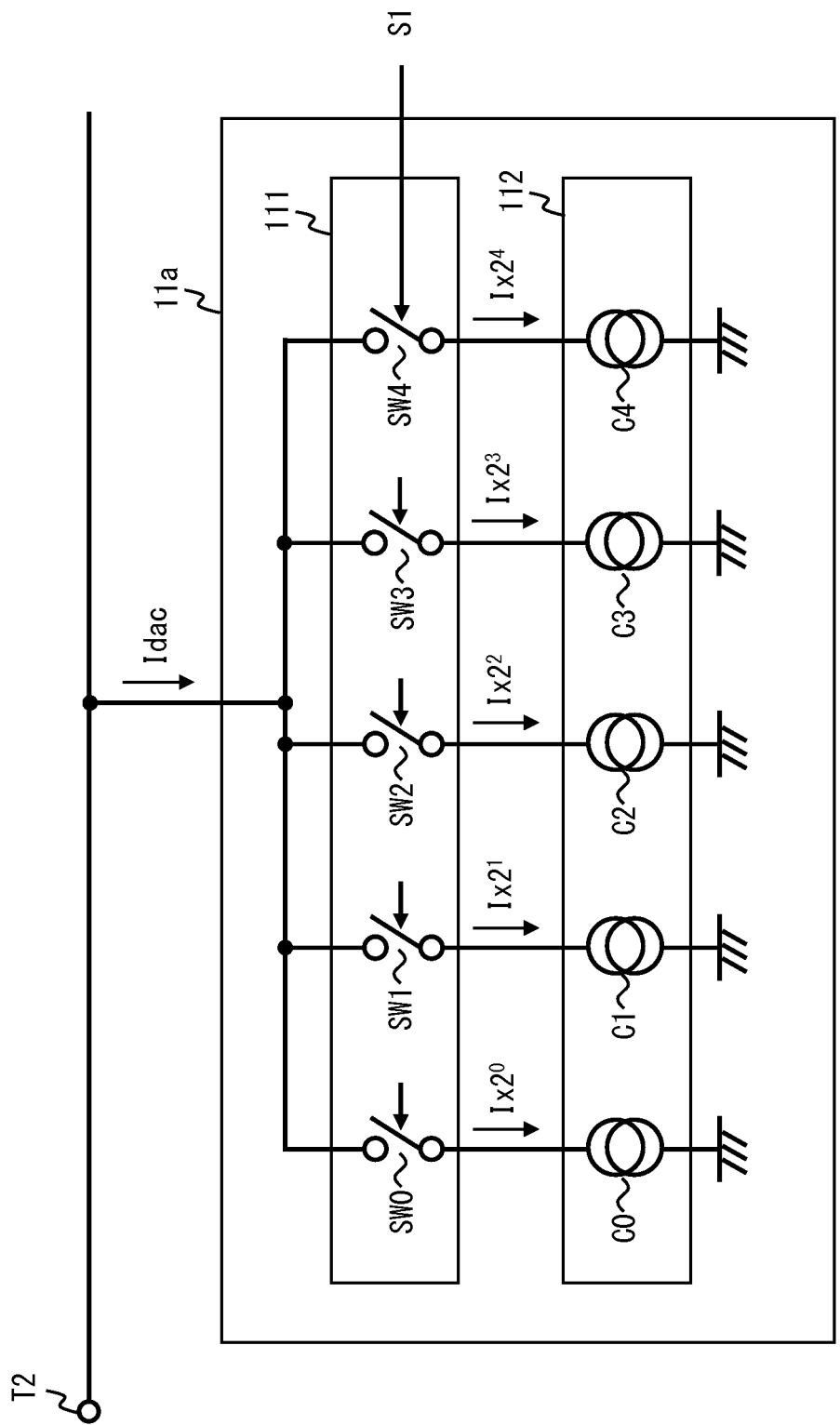
FIG. 3 is a diagram showing a specific configuration of a variable current generating unit provided in the semiconductor device shown in FIG. 2.

FIG. 3 is a diagram showing a specific configuration example of the variable current generating unit 11a.

As shown in FIG. 3, the variable current generating unit 11a is a so-called current output type DA converter, and includes: a switch group 111 including a plurality of switches SW0 to SWn−1 (n is a natural number); and a constant current source group 112 including a plurality of constant current sources C0 to Cn−1 (n is a natural number). In FIG. 3, a case where n=5 will be explained as an example.

The switches SW0 to SW4 are provided in parallel between the external terminal T2 and the ground voltage terminal GND. The constant current sources C0 to C4 are provided in series at the switches SW0 to SW4, respectively. If a reference current value is set to be I, the constant current sources C0 to C4 send current values I×2$^0$, I×2$^1$, I×2$^2$, I×2$^3$, and I×2$^4$ when the switches SW0 to SW4 are turned on, respectively.

The control signal S1 is represented with a binary value of a 5-bit width, such as "00000" and "00001". The switches SW0 to SW4 are turned off when values of zeroth to fourth bits of 5 bits included in the control signal S1 are 0, and are turned on when they are 1, respectively. Thereby, the variable current generating unit 11a can increase the direct current Idac in stages, whenever a value of the control signal S1 increases by one.

(More Detailed Configuration of Variable Current Generating Unit 11a)

Figure 4:
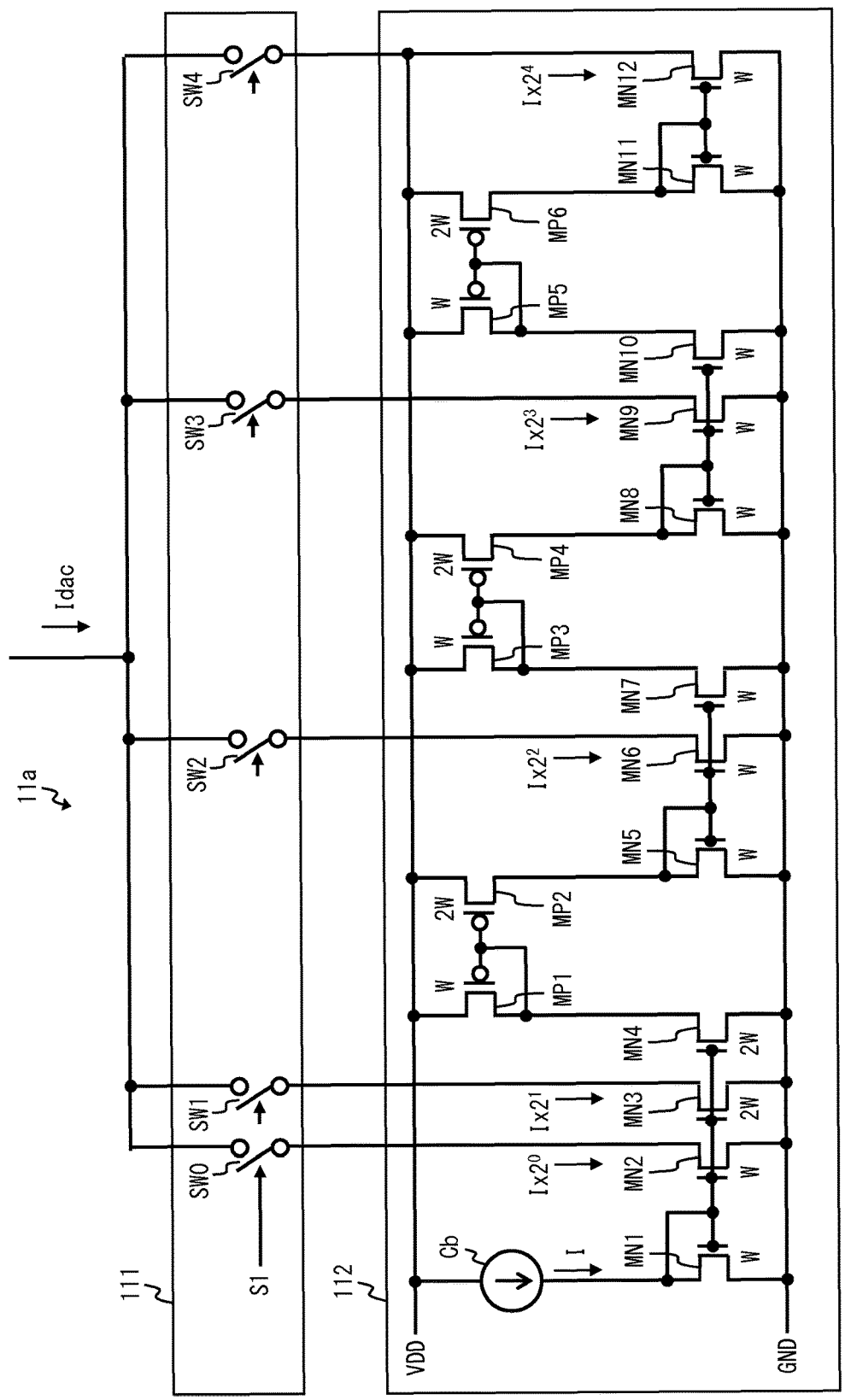
FIG. 4 is a diagram showing a more detailed configuration of the variable current generating unit provided in the semiconductor device shown in FIG. 2.

FIG. 4 is a diagram showing a more detailed configuration of the variable current generating unit 11a shown in FIG. 3. In FIG. 4, the plurality of constant current sources C0 to C4 included in the constant current source group 112 are represented at a transistor level.

As shown in FIG. 4, the constant current source group 112 includes: N-channel MOS transistors (hereinafter simply referred to as transistors) MN1 to MN12; P-channel MOS transistors (hereinafter simply referred to as transistors) MP1 to MP6; and a reference current source Cb. Note that a symbol of "W" or "2W" attached to each transistor of FIG. 4 represents a transistor size. The transistor of the transistor size 2W corresponds to two transistors of a transistor size W.

The reference current source Cb and the transistor MN1 (size W) is provided in series between the power supply voltage terminal VDD and the ground voltage terminal GND. The reference current source Cb, for example, sends a reference current I of 1 µA between a source and a drain of the transistor MN1.

The transistor MN2 (size W) is connected in series to the switch SW0, and is current-mirror connected to the transistor MN1. Accordingly, when the switch SW0 is turned on, a direct current Idac component (=I×2$^0$) of 1 µA of the same value as the reference current I flows through the transistor MN2.

The transistor MN3 (a size 2W) is connected in series to the switch SW1, and is current-mirror connected to the transistor MN1. Accordingly, when the switch SW1 is turned on, a direct current Idac component (=I×2$^1$) of 2 µA twice as much as the reference current I flows through the transistor MN3.

The transistor MN4 (size 2W) is current-mirror connected to the transistor MN1, and is connected in series to the transistor MP1 (size W). Accordingly, the current of 2 µA twice as much as the reference current I flows through the transistors MN4 and MP1. The transistor MP2 (size 2W) is current-mirror connected to the transistor MP1, and is connected in series to the transistor MN5 (size W). Accordingly, a current of 4 µA twice as much as the current that flows through the transistors MN4 and MP1 (four times as much as the reference current I) flows through the transistors MP2 and MN5.

The transistor MN6 (size W) is connected in series to the switch SW2, and is current-mirror connected to the transistor MN5. Accordingly, when the switch SW2 is turned on, a direct current Idac component (=I×2$^2$) of 4 µA of the same value as the current that flows through the transistors MP2 and MN5 (four times as much as the reference current I) flows through the transistor MN6.

The transistor MN7 (size W) is current-mirror connected to the transistor MN5, and is connected in series to the transistor MP3 (size W). Accordingly, a current of 4 µA of the same value as the current that flows through the transistors MP2 and MN5 (four times as much as the reference current I) flows through the transistors MN7 and MP3. The transistor MP4 (size 2W) is current-mirror connected to the transistor MP3, and is connected in series to the transistor MN8 (size W). Accordingly, a current of 8 µA twice as much as the current that flows through the transistors MN7 and MP3 (eight times as much as the reference current I) flows through the transistors MP4 and MN8.

The transistor MN9 (size W) is connected in series to the switch SW3, and is current-mirror connected to the transistor MN8. Accordingly, when the switch SW3 is turned on, a direct current Idac component (=I×2$^3$) of 8 µA of the same value as the current that flows through the transistors MP4 and MN8 (eight times as much as the reference current I) flows through the transistor MN9.

The transistor MN10 (size W) is current-mirror connected to the transistor MN8, and is connected in series to the transistor MP5 (size W). Accordingly, a current of 8 µA of the same value as the current that flows through the transistors MP4 and MN8 (eight times as much as the reference current I) flows through the transistors MN10 and MP5. The transistor MP6 (size 2W) is current-mirror connected to the transistor MP5, and is connected in series to the transistor MN11 (size W). Accordingly, a current of 16 µA twice as much as the current that flows through the transistors MN10 and MP5 (sixteen times as much as the reference current I) flows through the transistors MP6 and MN11.

The transistor MN12 (size W) is connected in series to the switch SW4, and is current-mirror connected to the transistor MN11. Accordingly, when the switch SW4 is turned on, a direct current Idac component (=I×2$^4$) of 16 µA of the same value as the current that flows through the transistors MP6 and MN11 (sixteen times as much as the reference current I) flows through the transistor MN12.

The case where n=5 has been explained as the example in FIG. 4, however, if n=16, i.e., if the variable current generating unit 11a is a 16-bit current output type DA converter, the number of transistors included in the variable current generating unit 11a is as follows. Note that the number of transistors shall be counted as one in a case of one transistor of the size W, and that the number of transistors shall be counted as two in a case of one transistor of the size 2W.

First, a breakdown of the number of transistors included in the constant current source group 112 is as follows.

The transistor (MN1) through which the reference current I flows . . . one (piece)

The transistor (MN2) that generates the current I×2$^0$ . . . one

The transistor (MN3) that generates the current I×2$^1$ . . . two

The transistors (MN4 to MN6, MP1, and MP2) that generate the current I×2$^2$ . . . seven The transistors (MN7 to MN9, MP3, and MP4) that generate the current I×2$^3$ . . . six The transistors that generate the current I×2$^4$ to the current I×2$^{15}$ . . . seventy-two (six×12 bits)

Accordingly, the number of transistors included in the constant current source group 112 results in eighty-nine.

In addition, since each of the switches SW0 to SW15 includes two transistors, the number of transistors included in the switch group 111 results in thirty-two.

Accordingly, the number of transistors included in the variable current generating unit 11a results in one hundred and twenty-one (=89+32). This is approximately ⅒ of the number of transistors of an AD converter that has an equal resolution. This also shows that the semiconductor device 1a can reduce a circuit scale and power consumption. Note that comparison of the above-described number of transistors is thoroughly one example.

(Operation of Resistance Measuring System SYS1a)

Subsequently, operation of the resistance measuring system SYS1a will be explained.

Figure 5:
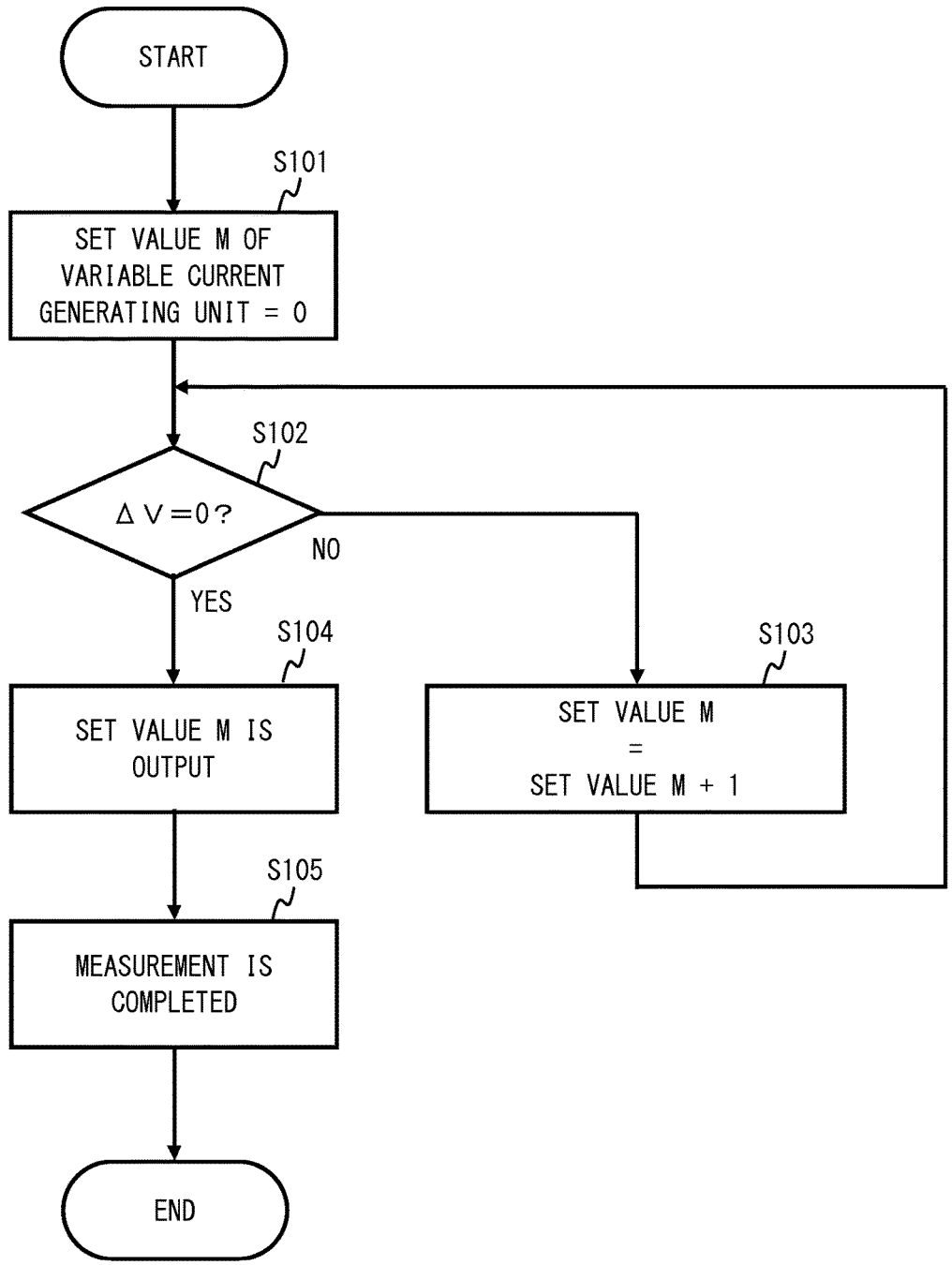
FIG. 5 is a flow chart showing operation of the resistance measuring system shown in FIG. 2.

FIG. 5 is a flow chart showing the operation of the resistance measuring system SYS1a.

As shown in FIG. 5, a set value M of the variable current generating unit 11a is set to be 0 in an initial state (step S101). Note that the set value M, for example, reflects a value of the control signal S1, and that the larger the set value M becomes, the larger the current value of the direct current Idac becomes. Accordingly, the current value of the direct current Idac is small in the initial state.

At this time, if the pressure-sensitive resistance element R4 receives a pressure (weight) from a measurement object, and the potential difference ΔV is generated (NO of step S102), the determination result D1 of the potential difference determining unit 12 becomes inactive. Therefore, the control unit 13 increases the set value M of the variable current generating unit 11a by one (step S103). Thereby, the current value of the direct current Idac becomes larger by one stage, and as a result, the potential Vb of the measurement node NB decreases by one stage.

After that, if the potential difference ΔV has been still generated (NO of step S102), the control unit 13 further increases the set value M of the variable current generating unit 11a by one in order to maintain the determination result D1 of the potential difference determining unit 12 inactive (step S103). Thereby, the current value of the direct current Idac becomes further larger by one stage, and as a result, the potential Vb of the measurement node NB further decreases by one stage.

The control unit 13 repeats operation of step S103 from NO of step S102 until the potential difference ΔV stops being generated, and the determination result D1 of the potential difference determining unit 12 is switched from inactive to active. That is, the control unit 13 outputs the control signal S1 so that the current value of the direct current Idac is increased in stages, until the potential difference ΔV stops being generated.

When the potential difference ΔV stops being generated (YES of step S102), the determination result D1 of the potential difference determining unit 12 is switched from inactive to active, and thus, the control unit 13, for example, outputs the control signal S1 so that the current value of the direct current Idac is not changed any more. In addition, the control unit 13 makes the variable current generating unit 11a output information of the set value M at that time (step S104).

That is, if the potential difference determining unit 12 determines that the potential difference ΔV has not been generated, the control unit 13 makes the variable current generating unit 11a output the information of the set value M at that time, i.e., the information of the direct current Idac at that time. Note that the control unit 13 may directly output the information of the set value M (information of the direct current Idac) instead of the variable current generating unit 11a.

Measurement is then completed (step S105).

As described above, the semiconductor device 1a and the resistance measuring system SYS1a including the same can exert effects equal to the case of the semiconductor device 1 and the resistance measuring system SYS1 including the same.

Although in the embodiment, a case where the potential difference determining unit 12 includes the amplifier circuit 121 and the comparator 122 has been explained as an example, the present invention is not limited to this. If the potential difference ΔV is large to some extent, the potential difference determining unit 12 need not necessarily include the amplifier circuit 121.

In addition, the potential difference determining unit 12 may include an AD converter 123 instead of the comparator 122. The AD converter 123 converts the potential difference ΔV or an amplified voltage thereof into a digital value, and outputs it as the determination result D1. In this case, since the control unit 13 can promptly set the set value M of the variable current generating unit 11a to be an optimum value based on the determination result D1, it becomes possible to efficiently control the potential difference ΔV to be 0 V. In addition, the AD converter 123 may just have a resolution at least equal to the comparator 122, and need not have a high resolution. For example, the AD converter 123 may be an AD converter of a low resolution with a built-in general-purpose MCU, etc. Therefore, increase in a circuit scale and power consumption caused by replacing the comparator 122 with the AD converter 123 is suppressed.

Second Embodiment

Figure 6:
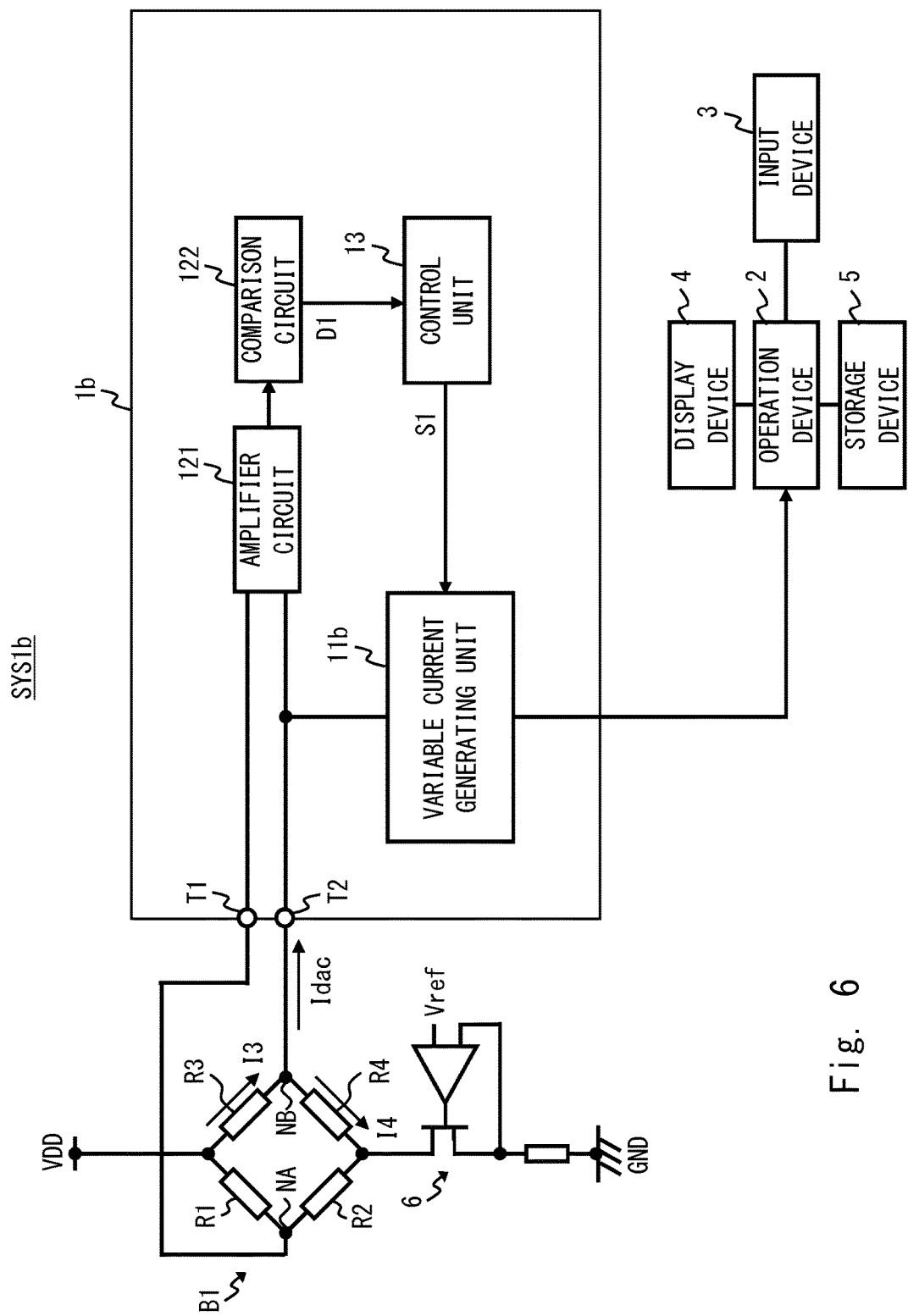
FIG. 6 is a block diagram showing a configuration example of a resistance measuring system including a semiconductor device according to a second embodiment.

FIG. 6 is a block diagram showing a configuration of a resistance measuring system SYS1b including a semiconductor device 1b according to a second embodiment. In FIG. 6, the semiconductor device 1b is shown as a specific configuration example of the semiconductor device 1. Since other configurations of the resistance measuring system SYS1b are similar to those of the resistance measuring system SYS1, the semiconductor device 1b will be mainly explained hereinafter.

As shown in FIG. 6, compared with the semiconductor device 1a, the semiconductor device 1b includes a variable current generating unit 11b instead of the variable current generating unit 11a.

(Specific Configuration Example of Variable Current Generating Unit 11b)

Figure 7:
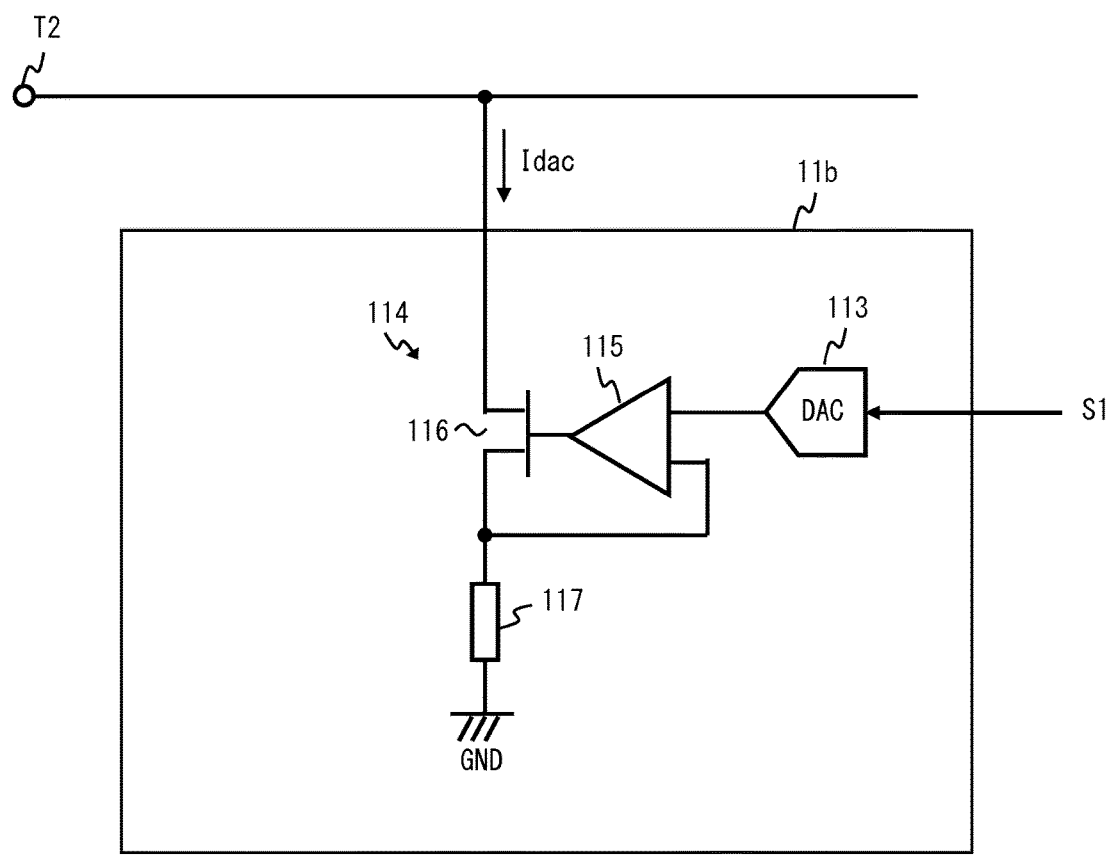
FIG. 7 is a diagram showing a specific configuration of a variable current generating unit provided in the semiconductor device shown in FIG. 6.

FIG. 7 is a diagram showing a specific configuration of the variable current generating unit 11b.

As shown in FIG. 7, the variable current generating unit 11b includes a voltage output type DA converter 113 and a voltage-current converting circuit 114.

The voltage output type DA converter 113, for example, includes a resistance ladder or a resistance string, and outputs a voltage of a value according to the control signal S1.

The voltage-current converting circuit 114 converts an output voltage of the DA converter 113 into the direct current Idac.

More specifically, the voltage-current converting circuit 114 has: an amplifier circuit 115; an N-channel MOS transistor (hereinafter simply referred to as a transistor) 116; and a resistance element 117. The transistor 116 and the resistance element 117 are provided in series between the external terminal T2 and the ground voltage terminal GND. The amplifier circuit 115 amplifies a potential difference between a voltage of a connection node between the transistor 116 and the resistance element 117, and the output voltage of the DA converter 113, and applies it to a gate of the transistor. Thereby, the voltage-current converting circuit 114 sends the direct current Idac according to the output voltage of the DA converter 113 from the external terminal T2 to the ground voltage terminal GND.

Since other configurations of the semiconductor device 1b are similar to those of the semiconductor device 1a, explanation thereof is omitted.

As described above, the semiconductor device 1b and the resistance measuring system SYS1b including the same can exert effects equal to the semiconductor device 1a and the resistance measuring system SYS1a including the same. Further, the semiconductor device 1b and the resistance measuring system SYS1b including the same can reduce a linearity error by configuring the voltage output type DA converter 113 with the resistance ladder or the resistance string.

Third Embodiment

Figure 8:
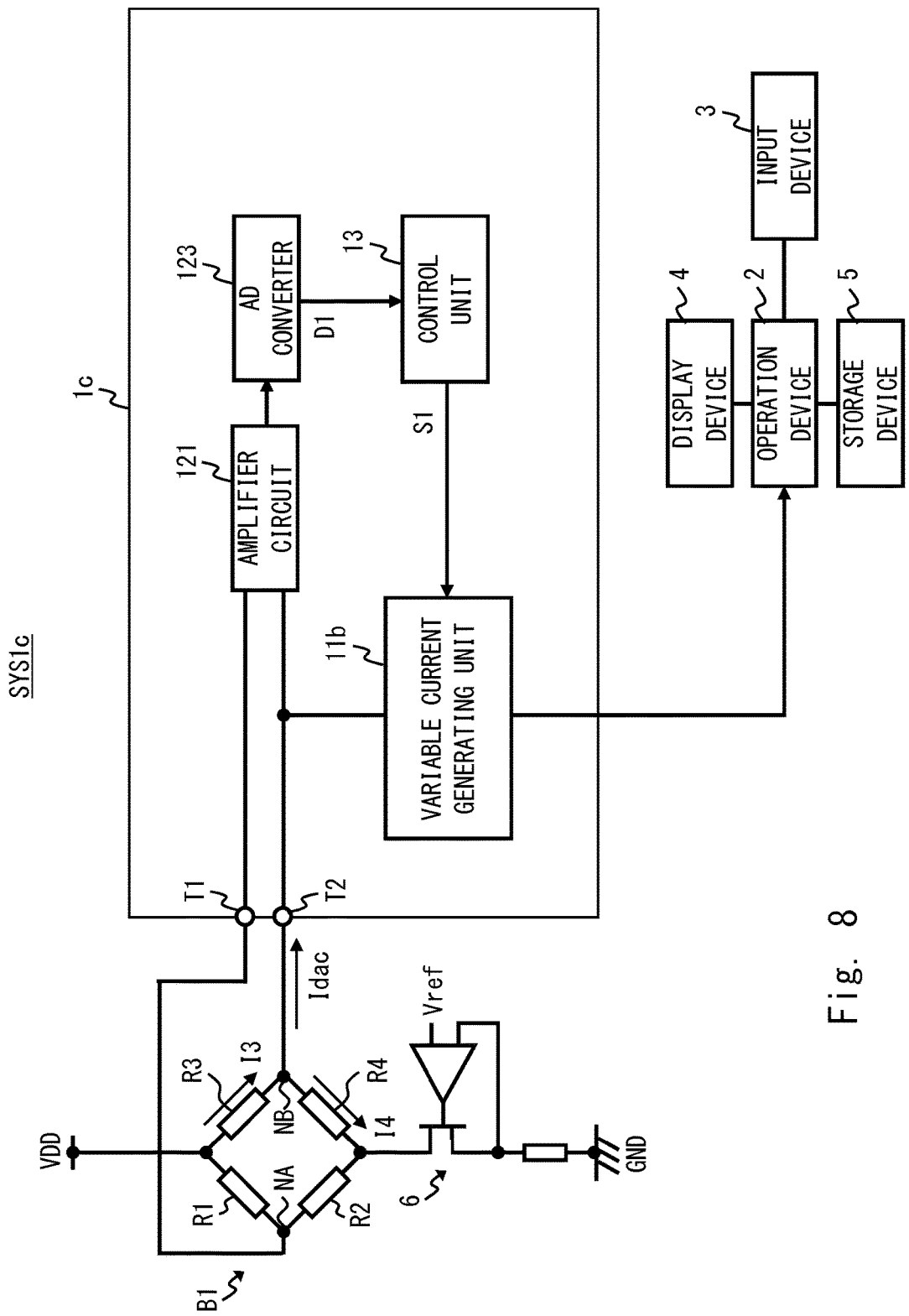
FIG. 8 is a block diagram showing a configuration example of a resistance measuring system including a semiconductor device according to a third embodiment.

FIG. 8 is a block diagram showing a configuration of a resistance measuring system SYS1c including a semiconductor device 1c according to a third embodiment.

In FIG. 8, the semiconductor device 1c is shown as a specific configuration example of the semiconductor device 1. Since other configurations of the resistance measuring system SYS1c are similar to those of the resistance measuring system SYS1, the semiconductor device 1c will be mainly explained hereinafter.

As shown in FIG. 8, compared with the semiconductor device 1b, the semiconductor device 1c includes the AD converter 123 instead of the comparator 122. Since other configurations of the semiconductor device 1c are similar to those of the semiconductor device 1b, explanation thereof is omitted.

The AD converter 123 converts the potential difference ΔV or an amplified voltage thereof into a digital value, and outputs it as the determination result D1. Thereby, since the control unit 13 can promptly set the set value M of the variable current generating unit 11b to be an optimum value based on the determination result D1, it becomes possible to efficiently control the potential difference ΔV to be 0 V. In addition, the AD converter 123 may just have a resolution at least equal to the comparator 122, and need not have a high resolution. For example, the AD converter 123 may be an AD converter of a low resolution with a built-in general-purpose MCU, etc. Therefore, increase in a circuit scale and power consumption caused by replacing the comparator 122 with the AD converter 123 is suppressed.

For example, if including the 6-bit DA converter 113 and the 10-bit AD converter 123, the semiconductor device 1c can measure change in a resistance value with accuracy equal to the configuration of the related technology including a 16-bit AD converter as a voltage measuring circuit.

As described above, the semiconductor devices and the resistance measuring systems including the same according to the above-described first to third embodiments measure a value of a direct current in a case of controlling the direct current that flows from one measurement node so as not to generate a potential difference between two measurement nodes of a bridge circuit. A change amount of a resistance value of a pressure-sensitive resistance element included in the bridge circuit can be calculated based on the value of the direct current measured at this time. Additionally, weight etc. can be estimated from the calculated change amount of the resistance value of the pressure-sensitive resistance element. Here, since the semiconductor devices and the resistance measuring systems including the same according to the above-described first to third embodiments can measure weight using a DA converter, a comparator, etc. that are general-purpose parts, and need not include a voltage measuring circuit with a high resolution unlike the related technology, increase in a circuit scale can be suppressed. In addition, increase in power consumption can also be suppressed.

Hereinbefore, although the invention made by the present inventor has been specifically explained based on the embodiments, the present invention is not limited to the already mentioned embodiments, and it is needless to say that various changes can be made without departing from the scope of the invention.

For example, in the semiconductor devices according to the above-described embodiments, a configuration may be employed in which a conductivity type (a p-type or an n-type) of a semiconductor substrate, a semiconductor layer, a diffusion layer (a diffusion region), etc. has been inverted. Therefore, when one conductivity type of the n-type and the p-type is set to be a first conductivity type, and the other conductivity type thereof is set to be a second conductivity type, the first conductivity type can be set to be the p-type, and the second conductivity type can be the n-type, or conversely, the first conductivity type can be set to be the n-type, and the second conductivity type can be the p-type.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
    a variable current generating unit that sends a direct current of a value according to a control signal from one measurement node of a bridge circuit in which a change amount of a resistance value of a pressure-sensitive resistance element appears as a potential difference between a first and a second measurement node;
    a potential difference determining unit that determines whether or not the potential difference falls within a range of a predetermined value; and
    a control unit that outputs the control signal to the variable current generating unit so that the variable current generating unit sends the direct current with which the potential difference falls within the range of the predetermined value based on a determination result of the potential difference determining unit.

2. The semiconductor device according to claim 1, wherein the potential difference determining unit includes a comparator that compares the potential difference with a ground voltage.

3. The semiconductor device according to claim 2, wherein
    the potential difference determining unit further includes an amplifier circuit that amplifies the potential difference, and
    the comparator compares an output voltage of the amplifier circuit with the ground voltage.

4. The semiconductor device according to claim 1, wherein the potential difference determining unit includes an AD converter that converts the potential difference into a digital value according thereto.

5. The semiconductor device according to claim 4, wherein
the potential difference determining unit further includes an amplifier circuit that amplifies the potential difference, and
the AD converter converts an output voltage of the amplifier circuit into a digital value according thereto.

6. The semiconductor device according to claim 1, wherein the control unit outputs the control signal so that a value of the direct current is changed in stages until the potential difference determining unit determines that the potential difference falls within the range of the predetermined value.

7. The semiconductor device according to claim 1, wherein the variable current generating unit includes a current output type DA converter that outputs the direct current according to the control signal.

8. The semiconductor device according to claim 1, wherein the variable current generating unit includes: a voltage output type DA converter that outputs a voltage according to the control signal; and a voltage-current converting circuit that converts the output voltage of the voltage output type DA converter into the direct current.

9. The semiconductor device according to claim 8, wherein the voltage output type DA converter includes a resistance ladder or a resistance string.

10. The semiconductor device according to claim 1, wherein the potential difference determining unit includes an AD converter that converts the potential difference into a digital value according thereto.

11. The semiconductor device according to claim 10, wherein
the potential difference determining unit further includes an amplifier circuit that amplifies the potential difference, and
the AD converter converts an output voltage of the amplifier circuit into a digital value according thereto.

12. The method according to claim 1, further comprising outputting, by the control unit, the control signal so that a value of the direct current is changed in stages until the potential difference determining unit determines that the potential difference falls within the range of the predetermined value.

13. A semiconductor device comprising:
a variable current generating unit that sends a current of a value according to a control signal from one measurement node in which a change amount of a resistance value of a pressure-sensitive resistance element appears as a potential difference between a first and a second measurement node;
a potential difference determining unit that determines whether the potential difference falls within a range of a predetermined value; and
a controller that outputs the control signal to the variable current generating unit so that the variable current generating unit sends the direct current with which the potential difference falls within the range of the predetermined value based on a determination result of the potential difference determining unit.

14. The semiconductor device according to claim 13, wherein the potential difference determining unit includes a comparator that compares the potential difference with a ground voltage.

15. The semiconductor device according to claim 14, wherein
the potential difference determining unit further includes an amplifier circuit that amplifies the potential difference,
the comparator compares an output voltage of the amplifier circuit with the ground voltage, and
the controller outputs the control signal so that a value of the direct current is changed in stages until the potential difference determining unit determines that the potential difference falls within the range of the predetermined value.

16. A method of a semiconductor device, the method comprising:
sending, by a variable current generating unit, a direct current of a value according to a control signal from one measurement node of a bridge circuit in which a change amount of a resistance value of a pressure-sensitive resistance element appears as a potential difference between a first and a second measurement node;
determining, by a potential difference determining unit, whether or not the potential difference falls within a range of a predetermined value; and
outputting, by a control unit, the control signal to the variable current generating unit so that the variable current generating unit sends the direct current with which the potential difference falls within the range of the predetermined value based on a determination result of the potential difference determining unit.

17. The method according to claim 16, wherein the determining includes comparing the potential difference with a ground voltage.

18. The method according to claim 17, wherein
the determining further includes amplifying the potential difference.

* * * * *